(12) United States Patent
Sato et al.

(10) Patent No.: US 10,896,843 B2
(45) Date of Patent: Jan. 19, 2021

(54) WAFER HOLDING DEVICE AND WAFER CHUCKING AND DECHUCKING METHOD

(71) Applicant: SUMITOMO HEAVY INDUSTRIES ION TECHNOLOGY CO., LTD., Tokyo (JP)

(72) Inventors: Fumiaki Sato, Ehime (JP); Suguru Hirokawa, Ehime (JP); Masamitsu Shinozuka, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 483 days.

(21) Appl. No.: 15/934,525

(22) Filed: Mar. 23, 2018

(65) Prior Publication Data

US 2018/0277418 A1  Sep. 27, 2018

(30) Foreign Application Priority Data

Mar. 24, 2017  (JP) .................................. 2017-059486

(51) Int. Cl.
*H01L 21/687* (2006.01)
*H01J 37/317* (2006.01)
(Continued)

(52) U.S. Cl.
CPC .... *H01L 21/68764* (2013.01); *H01J 37/3171* (2013.01); *H01L 21/67109* (2013.01); *H01L 21/68* (2013.01); *H01L 21/6833* (2013.01)

(58) Field of Classification Search
CPC ......... H01L 21/68764; H01L 21/67109; H01L 21/68; H01L 21/67103; H01L 21/6831;
(Continued)

(56) References Cited

U.S. PATENT DOCUMENTS 4,771,730 A * 9/1988 Tezuka ................ H01L 21/6831
118/723 E
5,310,453 A * 5/1994 Fukasawa ........... H01L 21/6833
438/716
(Continued)

FOREIGN PATENT DOCUMENTS

JP  S62-044332 A  2/1987
JP  S63-072877 A  4/1988
(Continued)

*Primary Examiner* — Yusef A Ahmed
(74) *Attorney, Agent, or Firm* — Michael Best & Friedrich LLP

(57) ABSTRACT

A wafer holding device includes a wafer chuck that includes a wafer holding surface coming into contact with a wafer to be held and a plurality of attraction regions provided on the wafer holding surface, and a controller configured to independently control an attraction force of an at least one of the plurality of attraction regions. In a case where fixing of the wafer is released, the controller establishes a temporarily fixing state in which the attraction force of the at least one of the plurality of attraction regions is smaller than an attraction force in fixing the wafer, and thereafter, the controller sets attraction forces of all of the plurality of attraction regions to be smaller than the attraction force in fixing the wafer.

18 Claims, 6 Drawing Sheets

(51) Int. Cl.
*H01L 21/68* (2006.01)
*H01L 21/683* (2006.01)
*H01L 21/67* (2006.01)

(58) Field of Classification Search
CPC ............ H01L 21/68757; H01L 21/6833; H01J 37/3171
See application file for complete search history.

(56) References Cited

U.S. PATENT DOCUMENTS

| | | | |
|---|---|---|---|
| 5,325,261 A | 6/1994 | Horwitz | |
| 5,460,684 A * | 10/1995 | Saeki | C23C 16/4586 156/345.51 |
| 5,542,559 A * | 8/1996 | Kawakami | H01L 21/6838 216/67 |
| 5,701,228 A * | 12/1997 | Ishii | H01L 21/6831 361/234 |
| 6,084,763 A * | 7/2000 | Hirano | H01L 21/67248 279/128 |
| 6,236,555 B1 | 5/2001 | Leeser | |
| 6,898,064 B1 * | 5/2005 | Berman | H01L 21/6831 361/233 |
| 2004/0218339 A1 * | 11/2004 | Nakamura | H01L 21/6831 361/234 |
| 2005/0016685 A1 * | 1/2005 | Emoto | G03F 7/70708 156/345.51 |
| 2005/0286202 A1 * | 12/2005 | Nakamura | H02N 13/00 361/234 |
| 2010/0025372 A1 * | 2/2010 | Tsujimoto | H01L 21/6833 216/71 |
| 2010/0243609 A1 * | 9/2010 | Yamazawa | H01J 37/3255 216/71 |
| 2011/0111601 A1 * | 5/2011 | Okita | H01L 21/67069 438/716 |
| 2011/0126765 A1 * | 6/2011 | Yamazawa | H01J 37/32091 118/723 MW |
| 2014/0008020 A1 * | 1/2014 | Nagayama | H01J 37/02 156/345.27 |
| 2014/0231389 A1 * | 8/2014 | Nagami | H01J 37/32944 216/67 |
| 2014/0262034 A1 * | 9/2014 | Ishibashi | H01J 37/321 156/345.29 |
| 2015/0004721 A1 * | 1/2015 | Akimoto | H01J 37/32972 438/9 |
| 2015/0303092 A1 * | 10/2015 | Kawabata | H02N 13/00 361/234 |
| 2016/0189994 A1 * | 6/2016 | Sasaki | H01L 21/67109 361/234 |
| 2016/0225645 A1 * | 8/2016 | Koizumi | H01L 21/6831 |
| 2017/0140957 A1 * | 5/2017 | Kitagawa | H01J 37/32724 |
| 2017/0243880 A1 * | 8/2017 | Matsuda | H01L 21/31144 |
| 2019/0088523 A1 * | 3/2019 | Matsuyama | H01L 21/3065 |

FOREIGN PATENT DOCUMENTS

| | | |
|---|---|---|
| JP | H02-135753 A | 5/1990 |
| JP | H06-022213 B2 | 3/1994 |
| JP | H07-029968 A | 1/1995 |
| JP | H08-078510 A | 3/1996 |
| JP | 3330945 B2 | 10/2002 |
| JP | 2003-179128 A | 6/2003 |
| JP | 2003-282691 A | 10/2003 |
| JP | 2004-047511 A | 2/2004 |
| JP | 2004-319840 A | 11/2004 |
| JP | 2005191338 A | 7/2005 |
| JP | 5174553 B2 | 1/2010 |
| JP | 4610042 B2 | 1/2011 |
| WO | WO-94/11944 A1 | 5/1994 |

* cited by examiner

WAFER HOLDING DEVICE AND WAFER CHUCKING AND DECHUCKING METHOD

RELATED APPLICATIONS

Priority is claimed to Japanese Patent Application No. 2017-059486, filed Mar. 24, 2017, the entire content of which is incorporated herein by reference.

BACKGROUND

Technical Field

Certain embodiment of the present invention relates to a wafer holding device and a wafer chucking and dechucking method.

Description of Related Art

In a semiconductor manufacturing process, a wafer holding device for holding a semiconductor wafer in a vacuum chamber is used, and for example, an electrostatic chuck employing an electrostatic force is used. In a case where a process in the vacuum chamber ends and fixing of the semiconductor wafer is released, a charge remaining in the wafer is removed to decrease the electrostatic force between the wafer and the chuck.

SUMMARY

According to an embodiment of the present invention, there is provided a wafer holding device, including: a wafer chuck that includes a wafer holding surface coming into contact with a wafer to be held and a plurality of attraction regions provided on the wafer holding surface; and a controller configured to independently control an attraction force of an at least one of the plurality of attraction regions. In a case where fixing of the wafer is released, the controller establishes a temporarily fixing state in which the attraction force of the at least one of the plurality of attraction regions is smaller than an attraction force in fixing the wafer, and thereafter, the controller sets attraction forces of all of the plurality of attraction regions to be smaller than the attraction force in fixing the wafer.

According to another embodiment of the present invention, there is provided a wafer chucking and dechucking method using a wafer chuck. The wafer chuck includes a wafer holding surface coming into contact with a wafer to be held and a plurality of attraction regions provided on the wafer holding surface. The method includes in a case where fixing of the wafer is released, establishing a temporarily fixing state in which an attraction force of an at least one of the plurality of attraction regions is smaller than an attraction force in fixing the wafer, and thereafter, setting attraction forces of all of the plurality of attraction regions to be smaller than the attraction force in fixing the wafer.

DETAILED DESCRIPTION

Figure 1:
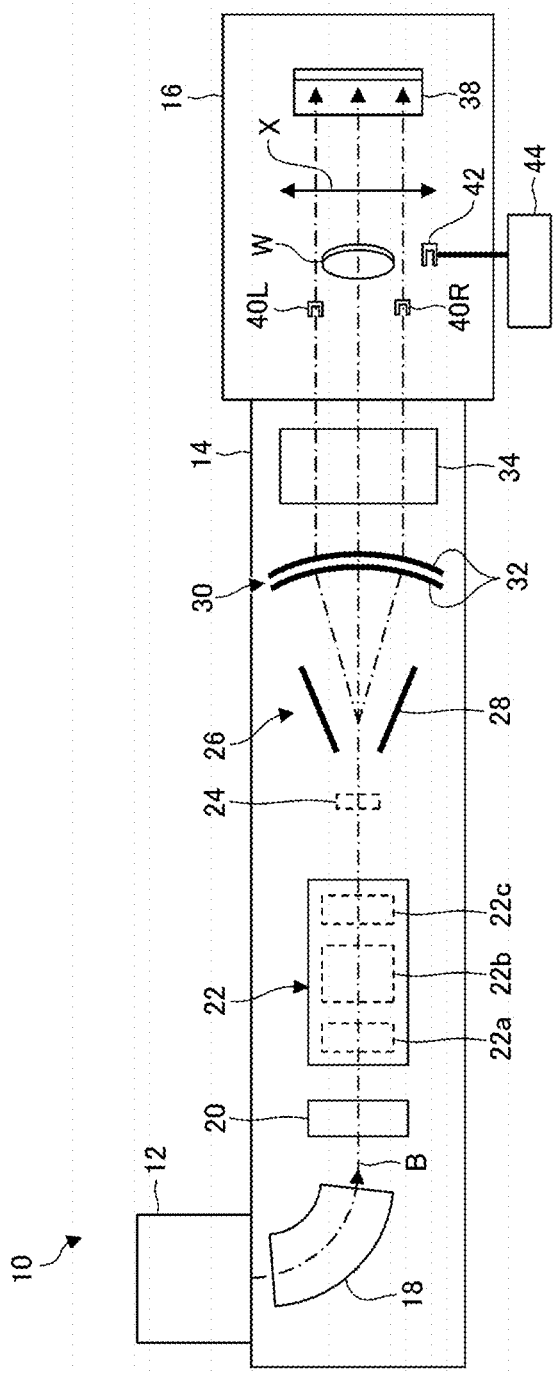
FIG. 1 is a top view showing a schematic configuration of an ion implanter according to an embodiment.

A gas may be accumulated between a wafer and a wafer chuck while the wafer is fixed to the wafer chuck. For example, a gas emitted from a resin film for protecting a back surface of the wafer or a heat transfer gas used to cool or heat the wafer may exist between the wafer and the chuck. In a case where the wafer is fixed in the vacuum chamber, the gas accumulated between the wafer and the chuck applies a force in a direction in which the wafer is separated from the chuck. Under such circumstances, if an attraction force between the wafer and the chuck decreases, there is a concern that the wafer jumps off the chuck by an expansion force of the gas and a position of the wafer is deviated. In a case where the positional deviation of the wafer is large, the wafer cannot be carried out from the inside of the vacuum chamber using a transport robot or the like, and a processing device should be stopped in order to take out the wafer.

It is desirable to provide a technology which decreases the positional deviation of the wafer when the fixing of the wafer is released.

Aspects of the present invention include arbitrary combinations of the above-described elements and mutual substitutions of elements or expressions of the present invention among apparatuses, methods, systems, or the like.

According to the present invention, it is possible to decrease a positional deviation of the wafer when fixing of the wafer is released.

Hereinafter, an embodiment of the present invention will be described in detail with reference to the drawings. In descriptions of the drawings, the same reference numerals are assigned to the same elements, and redundant descriptions thereof are appropriately omitted. The below-described configurations are only examples and the scope of the present invention is not limited by the configurations.

Figure 2:
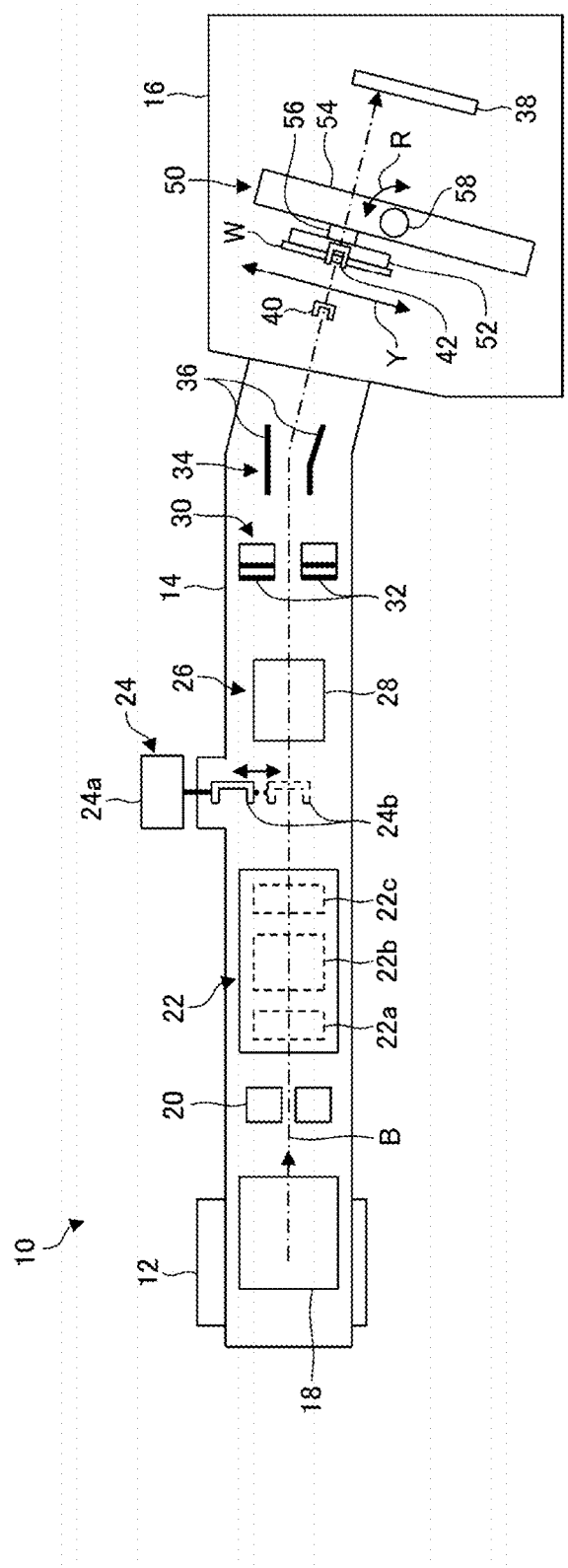
FIG. 2 is a side view showing the schematic configuration of the ion implanter of FIG. 1.

FIG. 1 is a top view schematically showing an ion implanter 10 according to an embodiment and FIG. 2 is a side view showing the schematic configuration of the ion implanter 10. The ion implanter 10 is an example of a wafer processing device in which a wafer holding device 52 according to an embodiment is used.

The ion implanter 10 is configured to implant ions to a surface of a workpiece W. For example, the workpiece W is a substrate or a semiconductor wafer. Hereinafter, for convenience of explanation, the workpiece W is referred to as a wafer W. However, this is not intended to limit an implantation target to a specific object.

The ion implanter 10 is configured to reciprocatingly perform scanning in one direction with a beam and reciprocatingly move the wafer W in a direction orthogonal to the one direction such that the entire processed surface of the wafer W is irradiated with an ion beam B. In the present specification, for convenience of explanation, a traveling direction of the ion beam B traveling a designed beam trajectory is defined as a z direction and a plane perpendicular to the z direction is defined as a xy plane. In a case where the workpiece W is scanned with the ion beam B, a scanning direction of the beam is referred to as an x direction, and a direction orthogonal to the z direction and the x direction is referred to as a y direction. Accordingly, the reciprocating scanning of the beam is performed in the x direction and the reciprocating movement of the wafer W is performed in the y direction.

The ion implanter 10 includes an ion source 12, a beamline unit 14, and an implantation process chamber 16. The ion source 12 is configured to provide the ion beam B to the beamline unit 14. The beamline unit 14 is configured to transport ions from the ion source 12 to the implantation process chamber 16. The ion implanter 10 includes an evacuation system (not shown) for providing desired vacuum environments to the ion source 12, the beamline unit 14, and the implantation process chamber 16.

For example, the beamline unit 14 includes a mass analyzer 18, a variable aperture 20, a beam shaping unit 22, a first beam measurement instrument 24, a beam scanner 26, a parallelizing lens 30 or a beam parallelizing unit, and an angular energy filter (AEF) 34 in order from the upstream side. The upstream side of the beamline unit 14 indicates a side close to the ion source 12, and a downstream side thereof indicates a side close to the implantation process chamber 16 (or beam stopper 38).

The mass analyzer 18 is provided on the downstream side of the ion source 12 and is configured to select desired ion species from the ions extracted from the ion source 12 by mass analysis.

The variable aperture 20 is an aperture of which an opening width can be adjusted, and adjust a beam current of the ion beam B passing through the aperture by changing the opening width. For example, the variable aperture 20 may include aperture plates which are disposed in upper and lower positions in a state where a trajectory is interposed therebetween and may adjust the beam current by changing a gap between the aperture plates.

The beam shaping unit 22 includes a focusing/defocusing lens such as a quadrupole focusing/defocusing unit (Q lens) and is configured to shape the ion beam B passing through the variable aperture 20 into a desired cross-sectional shape. The beam shaping unit 22 is an electric field type three-stage quadrupole lens (referred to as a triplet Q lens), and includes a first quadrupole lens 22a, a second quadrupole lens 22b, and a third quadrupole lens 22c in order from the upstream side. The beam shaping unit 22 can adjust convergence or divergence of the ion beam B incident into the wafer W independently in the x direction and the y direction using the three lens units 22a, 22b, and 22c. The beam shaping unit 22 may include a magnetic field type lens unit or may include a lens unit which shapes the beam using both an electric field and a magnetic field.

The first beam measurement instrument 24 is an injector flag Faraday cup which is disposed to be able to move into and out of the beam trajectory and measures a current of the ion beam. The first beam measurement instrument 24 is configured to be able to measure the beam current of the ion beam B which is shaped by the beam shaping unit 22. The first beam measurement instrument 24 includes a Faraday cup 24b which measures the beam current and a drive unit 24a which moves the Faraday cup 24b vertically. As shown by a dashed line in FIG. 2, in a case where the Faraday cup 24b is disposed on the beam trajectory, the ion beam B is blocked by the Faraday cup 24b. Meanwhile, as shown by a solid line in FIG. 2, in a case where the Faraday cup 24b is removed from the beam trajectory, the blocking of the ion beam B is released.

The beam scanner 26 is configured to supply the reciprocating scanning of the beam and is a deflector which performs scanning in the x direction with the shaped ion beam B. The beam scanner 26 includes a pair of scanning electrodes 28 which is provided to face each other in the x direction. The pair of scanning electrodes 28 is connected to a variable voltage power supply (not shown), which is periodically changes a voltage applied to the pair of scanning electrode 28 to change an electric field generated between the electrodes, and the ion beam B is deflected in various angles. In this way, the scanning of the ion beam B is performed over a scanning range in the x direction. In FIG. 1, the scanning direction and the scanning range of the beam are exemplified by an arrow X, and a plurality of trajectories of the ion beam B in the scanning range are shown by chain lines.

The parallelizing lens 30 is configured to cause the traveling directions of the scanned ion beam B to be parallel with the designed beam trajectory, respectively. The parallelizing lens 30 include a plurality of arc-shaped P lens electrodes 32 having a passing slit for the ion beam which is provided in the center portion of each P lens electrode 32. Each of the P lens electrodes 32 is connected to a high-pressure power supply (not shown) and applies an electric field generated by a voltage application to the ion beam B to parallelize the traveling direction of the ion beam B. The parallelizing lens 30 may be replaced by another beam parallelizing unit, and the beam parallelizing unit may be configured of a magnet unit using a magnetic field. An AD (Acceleration/Deceleration) column (not shown) for accelerating or decelerating the ion beam B may be provided on the downstream side of the parallelizing lens 30.

The angular energy filter (AEF) 34 is configured to analyze an energy of the ion beam B, deflect ions having a desired energy downward, and lead the ions to the implantation process chamber 16. The angular energy filter 34 includes an pair of AEF electrodes 36 for deflecting by an electric field. The pair of AEF electrodes 36 is connected to the high-voltage power supply (not shown). In FIG. 2, by applying a positive voltage to the upper AEF electrode and a negative voltage to the lower AEF electrode, the ion beam B is deflected downward. The angular energy filter 34 may be configured of a magnet unit for deflecting by a magnetic field, or may be configured of a combination of the pair of AEF electrodes for deflecting by the electric field and the magnet unit for deflecting by the magnetic field.

In this way, the beamline unit 14 supplies the ion beam B with which the wafer W is to be irradiated to the implantation process chamber 16.

As shown FIG. 2, a platen drive mechanism 50 holding one or a plurality of wafers W is included in the implantation process chamber 16. The platen drive device 50 includes a wafer holding device 52, a reciprocating motion mechanism 54, a twist angle adjustment mechanism 56, and a tilt angle adjustment mechanism 58. The wafer holding device 52 includes an electrostatic chuck or the like for holding the wafer W. The reciprocating motion mechanism 54 reciprocates the wafer holding unit 52 in a reciprocating direction (y direction) orthogonal to the beam scanning direction (x direction), and thus, the wafer held by the wafer holding device 52 is reciprocated in the y direction. In FIG. 2, the reciprocating motion of the wafer W is exemplified by an arrow Y.

The twist angle adjustment mechanism 56 is a mechanism which adjusts a rotation angle of the wafer W, and rotates the wafer W with a normal line of a wafer processed surface as a rotation axis so as to adjust a twist angle between an alignment mark provided on an outer peripheral portion of the wafer and a reference position. Here, the alignment mark of the wafer means a notch, an orientation flat or the like which is provided on the outer peripheral portion of the wafer, and is a mark which serves as a reference for an angular position in a crystal axis direction of the wafer or in a circumferential direction of the wafer. As shown in the drawings, the twist angle adjustment mechanism 56 is provided between the wafer holding device 52 and the reciprocating motion mechanism 54 and is reciprocated together with the wafer holding unit 52.

The tilt angle adjustment mechanism 58 is a mechanism which adjusts an inclination of the wafer W and adjusts a tilt angle between the traveling direction of the ion beam B toward the wafer processed surface and the normal line of the wafer processed surface. In the present embodiment, among inclination angles of the wafer W, an angle having an axis in the x direction as a central axis of the rotation is adjusted as the tilt angle. The tilt angle adjustment mechanism 58 is provided between the reciprocating motion mechanism 54 and a side wall of the implantation process chamber 16 and is configured to rotate the entire platen drive mechanism 50 including the reciprocating motion mechanism 54 in an R direction so as to adjust the tilt angle of the wafer W.

The implantation process chamber 16 includes the beam stopper 38. In a case where the wafer W does not exist on the beam trajectory, the ion beam B is incident into the beam stopper 38. A second beam measurement instrument 44 for measuring a beam current or a beam current density distribution of the ion beam is provided in the implantation process chamber 16. The second beam measurement instrument 44 includes side cups 40R and 40L and a center cup 42.

The side cups 40R and 40L are disposed to be deviated in the x direction with respect to the wafer W and are disposed at positions at which the side cups 40R and 40L do not block the ion beam directed to the wafer W during the ion implantation. The scanning of the ion beam B is performed beyond the range in which the wafer W is positioned, and thus, at least a portion of the scanning beam is incident into the side cups 40R and 40L during the ion implantation. Accordingly, the beam current is measured during the ion implantation. The measured values of the side cups 40R and 40L are sent to the second beam measurement instrument 44.

The center cup 42 measures the beam current or a beam current density distribution on the surface of the wafer w (wafer processed surface). The center cup 42 is movable, is retracted from a wafer position during the ion implantation, and is inserted into the wafer position when the wafer W is not positioned at an irradiation position. The center cup 42 measures the beam current while moving the x direction and measures the beam current density distribution in the beam scanning direction. The measured value of the center cup 42 is sent to the second beam measurement instrument 44. The center cup 42 may be formed in an array shape in which a plurality of Faraday cups are arranged in the x direction such that ion irradiation amounts at a plurality of positions in the beam scanning direction can be measured at the same time.

Figure 3:
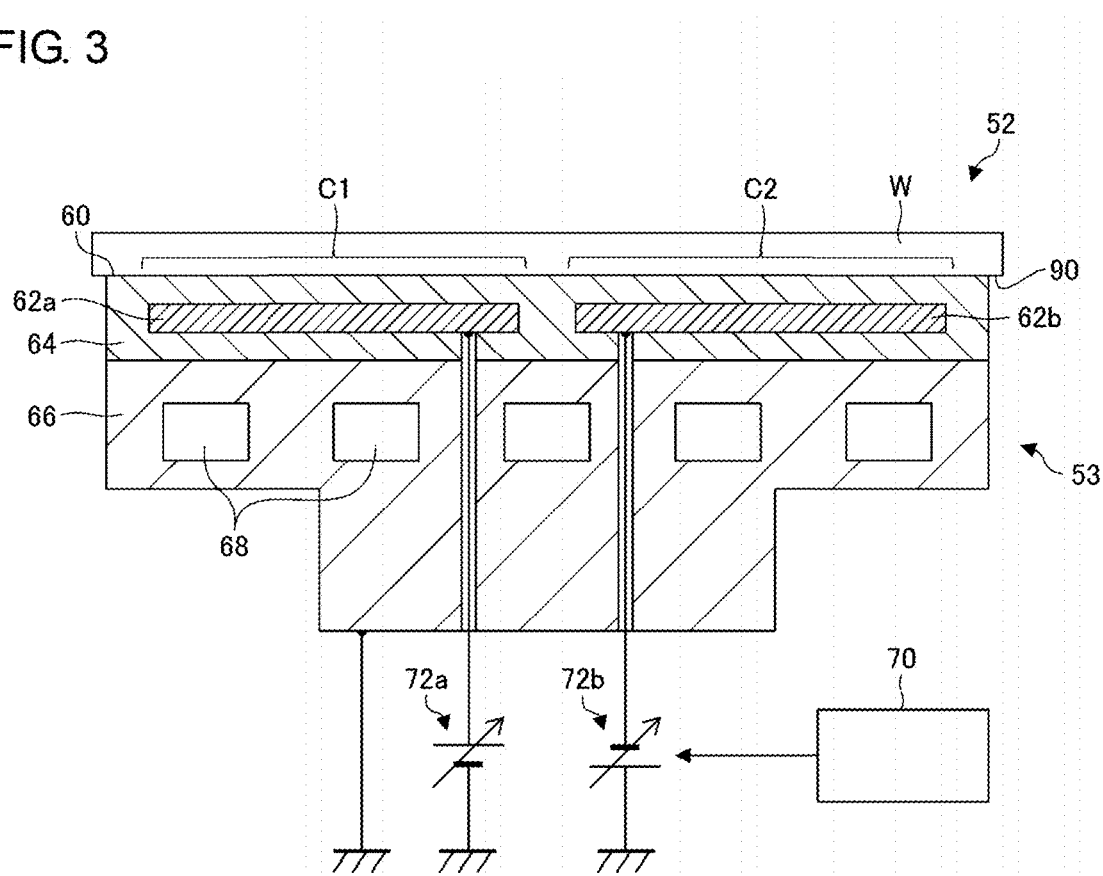
FIG. 3 is a sectional view schematically showing a configuration of a wafer holding device.
Figure 4:
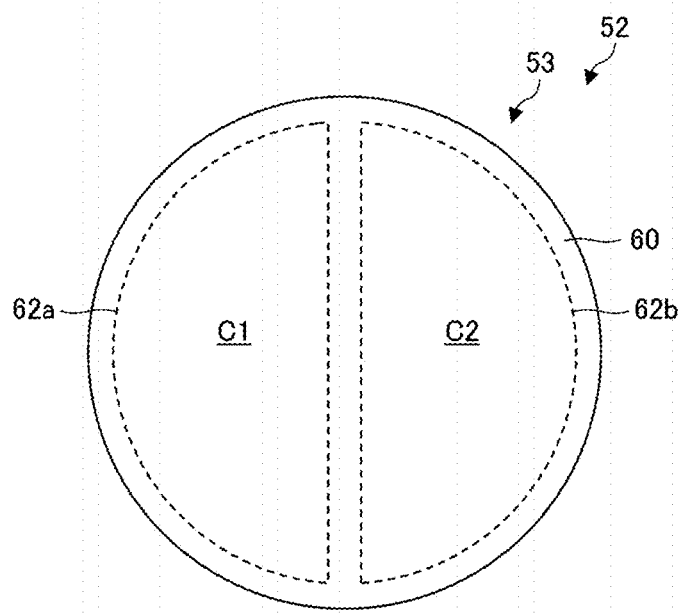
FIG. 4 is a top view schematically showing the configuration of the wafer holding device.

FIG. 3 is a sectional view schematically showing a configuration of the wafer holding device 52 and FIG. 4 is a top view schematically showing the configuration of the wafer holding device 52.

The wafer holding device 52 includes a wafer chuck 53 and a controller 70. The wafer chuck 53 includes a wafer holding surface 60 which comes into contact with the wafer W to be held and a plurality of attraction regions C1 and C2 are provided on the wafer holding surface 60. In the example shown in FIG. 4, two attraction regions C1 and C2 are provided. The first attraction region C1 and the second attraction region C2 are set so as not to overlap each other on the wafer holding surface 60, and each of the first attraction region C1 and the second attraction region C2 has a semicircular shape. The controller 70 is configured to independently control an attraction force of at least one of the plurality of attraction regions C1 and C2.

The wafer chuck 53 includes a plurality of electrode structures 62a and 62b, an insulating layer 64, and a base member 66. The insulating layer 64 is a portion which comes into direct contact with the wafer W and includes the wafer holding surface 60. For example, the insulating layer 64 is formed of a resin material such as polyimide, or a ceramic material such as aluminum nitride (AlN) or aluminum oxide ($Al_2O_3$). The insulating layer 64 is attached to the base member 66 and is supported by the base member 66.

The plurality of electrode structures 62a and 62b are provided inside the insulating layer 64. Each of the plurality of electrode structures 62a and 62b is provided at a position corresponding to each of the attraction regions C1 and C2 on the wafer holding surface 60. In the shown example, the first electrode structure 62a corresponding to the first attraction region C1 and a second electrode structure 62b corresponding to the second attraction region C2 are provided.

The first electrode structure 62a is connected to a first power supply 72a. The first electrode structure 62a generates an electrostatic attraction force in the first attraction region C1 by a DC voltage applied by the first power surface 72a. For example, the first electrode structure 62a has a single electrode body and generates an attraction force based on a Coulomb force or a Johnson-Rahbek force. The first electrode structure 62a may include a plurality of electrode bodies and an attraction force based on a gradient force may be generated by applying different voltages to the plurality of electrode bodies, respectively.

The second electrode structure 62b is connected to the second power supply 72b. The second electrode structure 62b generates an electrostatic attraction force in the second attraction region C2 by a DC voltage applied by the second power surface 72b. Similarly to the first electrode structure 62a, the second electrode structure 62b has a single electrode body and generates an attraction force based on a Coulomb force or a Johnson-Rahbek force. The second electrode structure 62b may include a plurality of electrode bodies and an attraction force based on a gradient force may be generated by applying different voltages to the plurality of electrode bodies, respectively.

The base member 66 is a support structure of the insulating layer 64 and is formed of a metal material such as stainless steel. The base member 66 is fixed to the twist angle adjustment mechanism 56 shown in FIG. 2. A cooling water channel 68 is provided inside the base member 66 and thus, the base member 66 is cooled by a fluid such as water passing through the cooling water channel 68. The base member 66 is connected to the ground.

The controller 70 controls operations of the first power supply 72a and the second power supply 72b so as to control the attraction forces of the first attraction region C1 and the second attraction region C2. For example, the controller 70 applies a positive voltage to the first electrode structure 62a and a negative voltage to the second electrode structure 62b so as to generate attraction forces in both the first attraction region C1 and the second attraction region C2. The controller 70 generates the attraction forces in all of the plurality of attraction regions C1 and C2 so as to establish a fixing state in which the wafer W is securely fixed to the wafer holding surface 60.

The controller 70 decreases absolute values of the voltages applied to the first electrode structure 62a and the second electrode structure 62b so as to decrease the attraction forces of the first attraction region C1 and the second attraction region C2. The controller 70 applies a ground voltage to both the first electrode structure 62a and the second electrode structure 62b in order to set electric potentials of the first electrode structure 62a and the second electrode structure 62b to be the same as the electric potential of the base member 66 such that the attraction forces are not generated in the first attraction region C1 and the second attraction region C2. The controller 70 performs the control such that the attraction forces are not generated in all of the plurality of attraction regions C1 and C2, and thus, the controller 70 establishes a fixing release state in which the fixing of the wafer W to the wafer holding surface 60 is released.

In order to release the fixing of the wafer W, the controller 70 establish a "temporarily fixing state" before establishing the above-described fixing release state. The temporarily fixing state means a state where the attraction force of one attraction region of the plurality of attraction regions C1 and C2 decreases while the attraction forces of the remaining attraction regions are maintained to be the attraction forces in the fixing state. For example, the controller 70 applies the same positive voltage as that in the fixing state to the first electrode structure 62a while applying the ground voltage to the second electrode structure 62b, and thus, a first temporarily fixing state in which the attraction force is generated in only the first attraction region C1 is established. Conversely, the controller 70 applies the same negative voltage as that in the fixing state to the second electrode structure 62b while applying the ground voltage to the first electrode structure 62a, and thus, a second temporarily fixing state in which the attraction force is generated in only the second attraction region C2 is established.

The controller 70 establishes the temporarily fixing state before releasing the fixing of the wafer W, and thus, the gas accumulated between the wafer chuck 53 and the wafer is evacuated to the outside. A resin layer for protecting the wafer or the like may be provided on a surface (back surface) 90 of the wafer W coming into contact with the wafer holding surface 60, and a gas may be emitted in the high-vacuum implantation process chamber 16. In this case, if the fixing state of the wafer W is continuously maintained, the gas is accumulated between the wafer chuck 53 and the wafer W. The gas accumulated between the wafer W and the wafer chuck 53 applies an expansion force in a direction in which the wafer W is separated from the wafer chuck 53. If the fixing of the wafer W is released in a state where the gas is accumulated, the wafer W may jump upward on the wafer holding surface 60 by the expansion force of the gas and a position of the wafer W may be deviated from the fixing state. If the positional deviation of the wafer W is large, a robot or the like for transporting the wafer W to and from the wafer holding device 52 cannot recover the wafer W, and the operation of the ion implanter 10 must be stopped for taking out the wafer W. If the implantation process chamber 16 is exposed to the atmosphere and the wafer W is taken out from the implantation process chamber 16, it takes a long time in order to set the state of the implantation process chamber 16 to be a high-vacuum state and operable again. As a result, productivity of the ion implanter 10 largely decreases deteriorates. Accordingly, in the present embodiment, in order to prevent the wafer W from jumping upward when the fixing of the wafer W is released, the gas between the wafer chuck 53 and the wafer W is evacuated in advance before the fixing of the wafer W is released.

Figure 5:
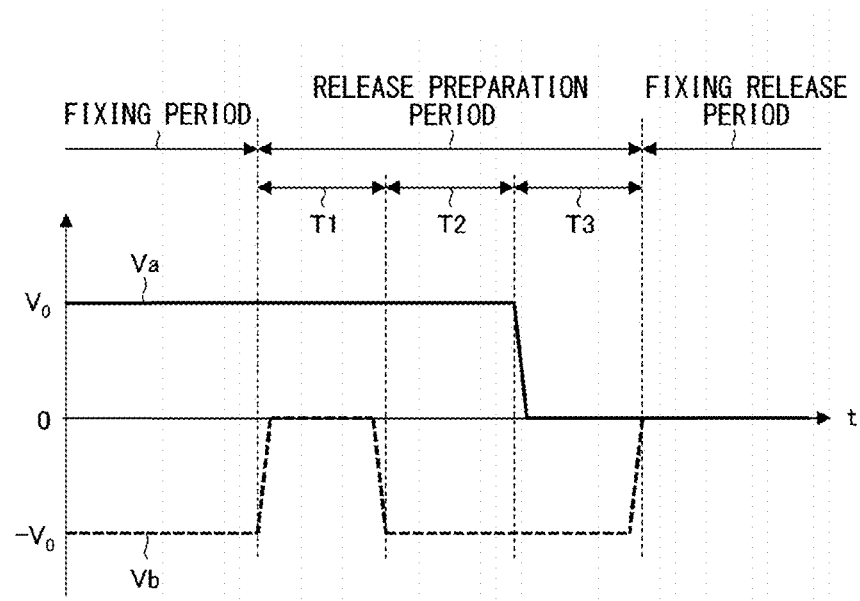
FIG. 5 is a graph showing an example of a voltages applied to a plurality of electrode structures.

FIG. 5 is a graph showing an example of voltages Va and Vb applied to the plurality of electrode structures 62a and 62b, respectively, and shows voltage waveforms when a period is shifted from a fixing period to a fixing release period via a release preparation period. A solid line in the graph indicates the first voltage Va which is applied to the first electrode structure 62a by the first power supply 72a and a dashed line in the graph indicates the second voltage Vb which is applied to the second electrode structure 62b by the second power supply 72b. In the fixing state of the wafer W, the first voltage $Va=V_0$ is satisfied, and the second voltage $Vb=-V_0$ is satisfied. A magnitude (absolute value) of a reference voltage $V_0$ applied in a fixing state is dependent on the specifications of the wafer chuck 53, is approximately 0.1 kV to 10 kV, and is approximately 0.5 kV to 2 kV, for example.

In a first period T1 of the release preparation period, the second voltage Vb applied to the second electrode structure 62b is set to 0 V while the first voltage Va applied to the first electrode structure 62a is maintained at the reference voltage $V_0$. Accordingly, the first temporarily fixing state is established in which the attraction force in the second attraction region C2 decreases enough while the attraction force is maintained in the first attraction region C1, and thus, the gas accumulated between the wafer W and the second attraction region C2 is evacuated to the outside. It is preferable that the first temporarily fixing state is maintained to such an extent that the gas between the wafer W and the second attraction region C2 is sufficiently evacuated. Meanwhile, if the maintaining duration of the first temporarily fixing state increases, productivity of the ion implanter 10 deteriorates. Preferably, a length of the first period T1 is 0.1 seconds to 10 seconds, and for example, more preferably, is 0.5 seconds to 5 seconds. As an example, the length of the first period T1 is approximately 1 second or 2 seconds.

Subsequently, in a second period T2 of the release preparation period, the second voltage Vb applied to the second electrode structure 62b is set again to be the reference voltage $-V_0$, and thus, attraction forces are generated in both the first attraction region C1 and the second attraction region C2. Accordingly, the state in the second period T2 is the same as the fixing state, and the attraction forces in both the first attraction region C1 and the second attraction region C2 return to the attraction forces in fixing the wafer. The second period T2 is a transition period for shifting to a subsequent third period T3, and is a period due to which the attraction forces of both the first attraction region C1 and the second attraction region C2 is prevented from being removed and the state is prevented from becoming the fixing release state in the temporarily fixed state. It is preferable that the second period T2 is maintained until a sufficient attraction force is generated in the second attraction region C2. Preferably, the second period T2 is 0.1 seconds to 10 seconds, and more preferably, is 0.5 seconds to 5 seconds. As an example, the length of the second period T2 is approximately 1 second or 2 seconds.

Next, in the third period T3 of the release preparation period, the first voltage Va applied to the first electrode structure 62a is set to 0 V, and the second voltage Vb applied to the second electrode structure 62b is maintained at the reference voltage $-V_0$. Accordingly, the second temporarily fixing state is established in which the attraction force of the first attraction region C1 decreases enough while the attraction force is maintained in the second attraction region C2, and the gas accumulated between the wafer W and the first attraction region C1 is evacuated to the outside. It is preferable that the second temporarily fixing state is maintained to such an extent that the gas between the wafer W and the first attraction region C1 is sufficiently evacuated. Preferably, a length of the third period T3 is 0.1 seconds to 10 seconds, and more preferably, is 0.5 seconds to 5 seconds. As an example, the length of the third period T3 is approximately 1 second or 2 seconds.

In the fixing release period after the third period T3, the first voltage Va applied to the first electrode structure 62a is maintained at 0 V and the second voltage Vb applied to the second electrode structure 62b is set to 0 V. Accordingly, the attraction forces of the first attraction region C1 and the second attraction region C2 are removed, and thus, the fixing release state is established. In the present embodiment, the gas does not exist between the wafer chuck 53 and the wafer W in the fixing release period, or even if the gas exists, the amount of the gas in the fixing release period is sufficiently smaller than that in the fixing period. Accordingly, the jumping upward of the wafer W due to expansion of the gas does not happen, or even if the jumping upward of the wafer W happens, a large positional deviation of the wafer W does not happen. Therefore, according to the present embodiment, it is possible to appropriately prevent the positional deviation of the wafer W when the fixing of the wafer W is released, and it is possible to suppress the deterioration of productivity of the device using the wafer holding device 52.

In the example shown in FIG. 5, the second temporarily fixing state is established after the first temporarily fixing state is established. However, regardless of the order of execution, the first temporarily fixing state may be established after the second temporarily fixing state is established.

The controller 70 may change the lengths of the above-described first period T1, second period T2, and third period T3 according to a condition related to the wafer W held by the wafer holding device 52. For example, the length of the above-described temporary fixing time may be lengthened in a case where it is assumed that the amount of the gas accumulated between the wafer W and the wafer chuck 53 is large, and the length of the temporary fixing time may be shortened in a case where it is assumed that the amount of the accumulated gas is small.

For example, the amount of the accumulated gas increases as the fixing time of the wafer W is lengthened, and thus, the length of the temporary fixing time may be changed according to the fixing time of the wafer W. In a case where the wafer W is heated by the implantation of ions into the wafer W and the temperature of the wafer increases, the gas may be easily emitted from the back surface 90. Therefore, the length of the temporary fixing time may be changed according to an input heat quantity into the wafer W. The length of the temporary fixing time may be changed according to a material of the back surface 90 of the wafer W coming into contact with the wafer holding surface 60. For example, the temporary fixing time may be lengthened in a case where a resin material from which a large amount of gas is emitted is used, and the temporary fixing time may be shortened in a case where an inorganic material such as oxide or a nitride from which a small amount of gas is emitted is used. The length of the temporary fixing time may be changed according to a weight, a thickness, or the like of the wafer W.

During the release preparation period, the controller 70 may perform each of the above-described first temporarily fixing state and second temporarily fixing state two or more times. For example, the first temporarily fixing state and the second temporarily fixing state may be alternately repeated so as to evacuate a larger amount of gas accumulated between the wafer W and the wafer chuck 53. In a case where the amount of the accumulated gas is assumed to be large according to the condition related to the wafer W, the number of repetition of the first temporarily fixing state and the second temporarily fixing state may increase so as to more effectively evacuate the gas.

In a case where the controller 70 decreases the attraction force of at least one attraction region during the release preparation period, the controller 70 may not totally remove the attraction force and may only decrease the attraction force such that the attraction force is smaller than the attraction force in the fixing state. For example, during the first temporarily fixing state, the controller 70 may set the magnitude (absolute value) of the second voltage Vb applied to the second electrode structure 62b to approximately $\frac{1}{10}$ to $\frac{1}{2}$ of the reference voltage $V_0$ during the fixing. That is, the second voltage Vb may not be set to 0 V during the first temporarily fixing state. Similarly, during the second temporarily fixing state, the controller 70 may not set the first voltage Va to 0 V and may set the first voltage Va to approximately $\frac{1}{10}$ to $\frac{1}{2}$ of the reference voltage $V_0$.

In a case where the state is shifted from the fixing state to the temporarily fixing state, the controller 70 may decrease the magnitude (absolute value) of the voltage applied to the electrode structure in stages such that the attraction force of the at least one attraction region decreases in stages.

The controller 70 may change a maintaining time of the temporarily fixing state, a voltage of the temporarily fixing state, and the number of repetition of the first temporarily fixing state and the second temporarily fixing state according to the voltage value of the implantation process chamber 16 in which the wafer holding device 52 is provided. For example, if an increase of the pressure value in the implantation process chamber 16 in the temporarily fixing state is relatively small with respect to a gas emitting amount assumed according to the condition related to the above-described wafer W, the controller 70 may determine that the gas is not sufficiently evacuated, and thus, may lengthen the maintaining time of the temporarily fixing state, decrease the voltage of the temporarily fixing state, or increase the number of times of execution of the temporarily fixing state. The controller 70 may adjust the maintaining time of the temporarily fixing state, the voltage of the temporarily fixing state, or the number of repetition of the temporarily fixing state according to a change amount or a change speed of the pressure value of the implantation process chamber 16.

Figure 6:
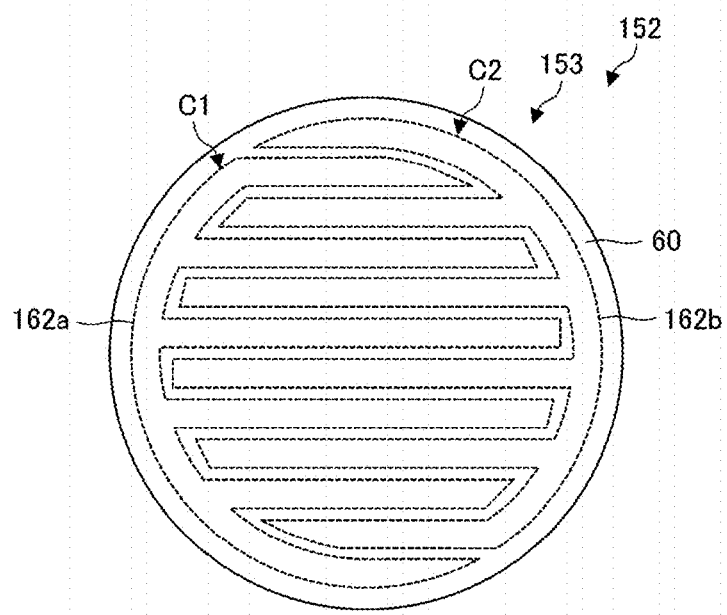
FIG. 6 is a top view schematically showing a configuration of a wafer holding device according to a modification example.

FIG. 6 is a top view schematically showing a configuration of a wafer holding device 152 according to a modification example. In the present modification example, shapes of a first electrode structure 162a and a second electrode structure 162b are different from those of the above-described embodiment, each of the electrode structures 162a and 162b is formed in a comb shape, and the electrode structures 162a and 162b are disposed to interpose with each other. Accordingly, the attraction regions C1 and C2 respectively corresponding to the electrode structures 162a and 162b are formed in a comb shape. In the present modification example, a temporarily fixing state similar to that of the above-described embodiment is used, and thus, it is possible to prevent the wafer W from jumping upward when the fixing of the wafer W is released.

Figure 7:
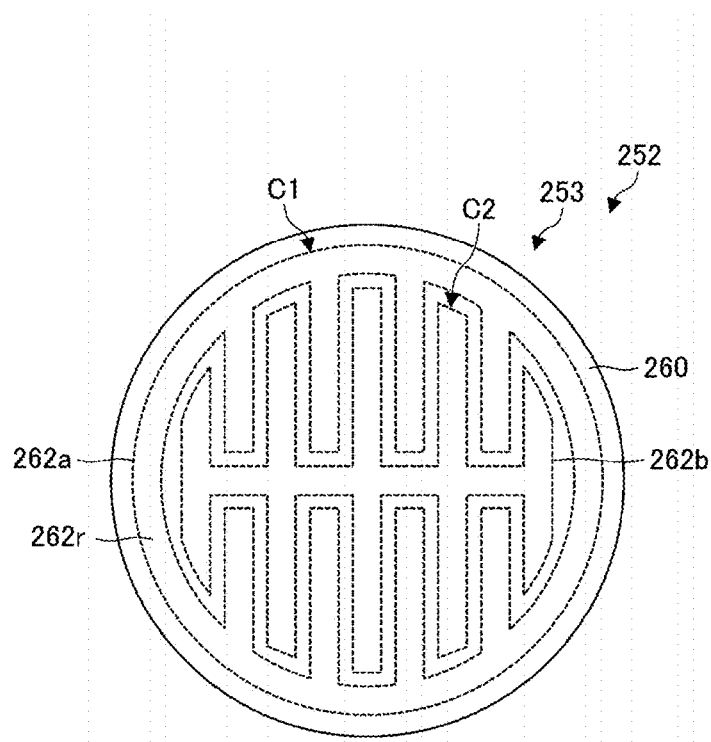
FIG. 7 is a top view schematically showing a configuration of a wafer holding device according to another modification example.

FIG. 7 is a top view schematically showing a configuration of a wafer holding device 252 according to another modification example. Similarly to FIG. 6, in the present modification example, each of a first electrode structure 262a and a second electrode structure 262b is formed in a comb shape, and the first electrode structure 262a and the second electrode structure 262b are disposed to interpose with each other. The first electrode structure 262a includes an outer peripheral electrode portion 262r which is formed in a closed loop shape along an outer periphery of a wafer holding surface 260. Accordingly, the first attraction region C1 corresponding to the first electrode structure 262a includes a closed-loop-shaped region along the outer periphery of the wafer holding surface 260. Meanwhile, the second attraction region C2 corresponding to the second electrode structure 262b is disposed inside the first attraction region C1 on the wafer holding surface 260.

In the present modification example, in a case where the first temporarily fixing state is established in which the attraction force of the second attraction region C2 decreases while the attraction force of the first attraction region C1 is maintained, an outer peripheral region of the wafer W is fixed, and thus, the gas cannot be evacuated to the outside. Accordingly, in the present modification example, the gas is evacuated by using only the second temporarily fixing state and the first temporarily fixing state may not be used. The first temporarily fixing state may be established such that the gas moves from the second attraction region C2 to a region between the first attraction region C1 and the second attraction region C2, and thereafter, the second temporarily fixing state may be established, and thus, the gas in the regions of both the first attraction region C1 and the second attraction region C2 may be evacuated to the outside.

Figure 8:
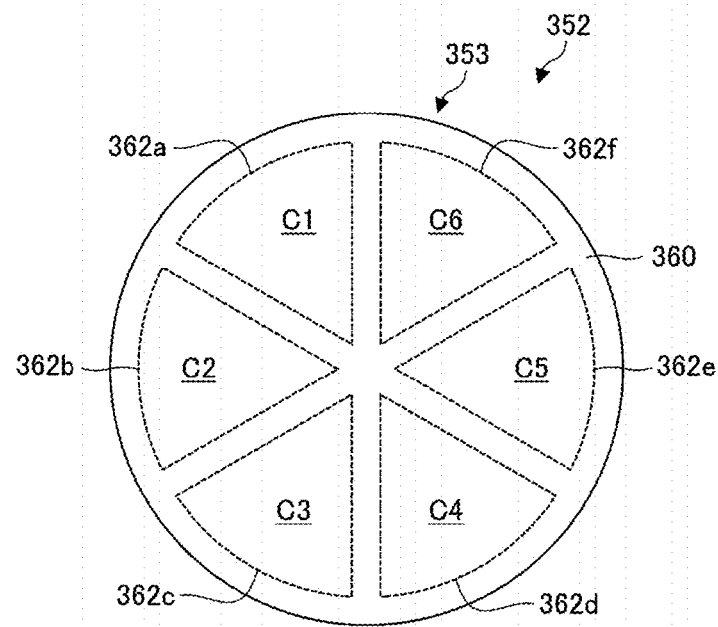
FIG. 8 is a top view schematically showing a configuration of a wafer holding device according to still another modification example.

FIG. 8 is a top view schematically showing a configuration of a wafer holding device 352 according to still another modification example. In the present modification example, three or more electrode structures are provided in a wafer chuck 353, and specifically, six electrode structures 362a, 362b, 362c, 362d, 362e, and 362f are provided. Each of the electrode structures 362a to 362f has a fan shape and is disposed in each region which is apart of a circular wafer holding surface 360 equally divided into six. Each of attraction regions C1, C2, C3, C4, C5, and C6 corresponding to the electrode structures 362a to 362f is set to have a fan shape.

In the present modification example, the attraction force is generated in each of the attraction regions C1 to C6, and thus, voltages having polarities different between the adjacent electrode structures are applied to the electrode structures, respectively. For example, a positive voltage is applied to the first electrode structure 362a, the third electrode structure 362c, and the fifth electrode structure 362e, and a negative voltage is applied to the second electrode structure 362b, the fourth electrode structure 362d, and the sixth electrode structure 362f.

In the present modification example, the attraction force of at least one of the plurality of attraction regions C1 to C6 is decreased, the attraction forces of the other attraction regions are maintained, and thus, the temporarily fixing state is established. The at least one of the plurality of attraction regions in which the attraction force is decreased is sequentially switched such that the accumulated gas in all of the plurality of attraction regions C1 to C6 is removed. For example, the attraction force is sequentially decreased one by one from the first attraction region C1 to the sixth attraction region C6. In this case, while the period is shifted from the fixing period to the fixing release period, the attraction forces of all of the plurality of attraction regions C1 to C6 are not simultaneously decreased and the fixing of the wafer is not released, and thus, it is possible to prevent the wafer W from jumping upward. In the present modification example, three or more attraction regions are provided, and thus, when the at least one of the plurality of attraction regions in which the attraction force is decreased is switched, the region may be switched without interposition of a fixing state such as the state of the above-described second period T2.

In the present modification example, the attraction forces of two or more regions among the plurality of attraction regions C1 to C6 may be simultaneously decreased. In this case, in order to prevent a nonuniform attraction force from being applied to the wafer W, the attraction forces of the regions being at symmetrical positions with respect to the center of the wafer holding surface 360 may be simultaneously decreased. For example, only the attraction forces of the first attraction region C1 and the fourth attraction region C4 may be simultaneously decreased. Then, only the attraction forces of the second attraction region C2 and the fifth attraction regions C5 may be simultaneously decreased. Finally, only the attraction forces of the third attraction region C3 and the sixth attraction region C6 may be simultaneously decreased.

In the present modification example, a three-phase AC voltage may be applied such that the attraction force is generated in each of the attraction regions C1 to C6. For example, a U phase is applied to the first electrode structure 362a and the fourth electrode structure 362d, a V phase is applied to the second electrode structure 362b and the fifth electrode structure 362e, and a W phase is applied to the third electrode structure 362c and the sixth electrode structure 362f. In a case where the AC voltage is used, the attraction force is changed in correspondence with a change of one period of the AC voltage, and thus, the attraction force can be largely decreased at a timing in which the voltage becomes 0 V. However, the timings in which the voltages of the U phase, the V phase, and the W phase become 0 V are different from each other, and the attraction forces are not simultaneously decreased in all the attraction regions. Accordingly, it is possible to securely fix the wafer W.

Meanwhile, the timing in which the voltage becomes 0 V when the AC voltage is applied is extremely short, and thus, the gas may be accumulated between the wafer W and the wafer chuck 353. Accordingly, in the temporarily fixing state, the voltage of at least one of the plurality of electrode structures 362a to 362f is fixed to 0 V such that the gas in the corresponding attraction region is sufficiently evacuated. The period for which the 0 V is applied is longer than one period of the applied AC voltage in the fixing state. 0 V is maintained during the period which is longer than the one period of the AC voltage, and thus, the gas accumulated between the wafer W and the wafer chuck 353 can be effectively evacuated. An amplitude of the AC voltage applied to the at least one of the electrode structures may be set to be smaller than that of the fixing state to realize the temporarily fixing state.

Figure 9:
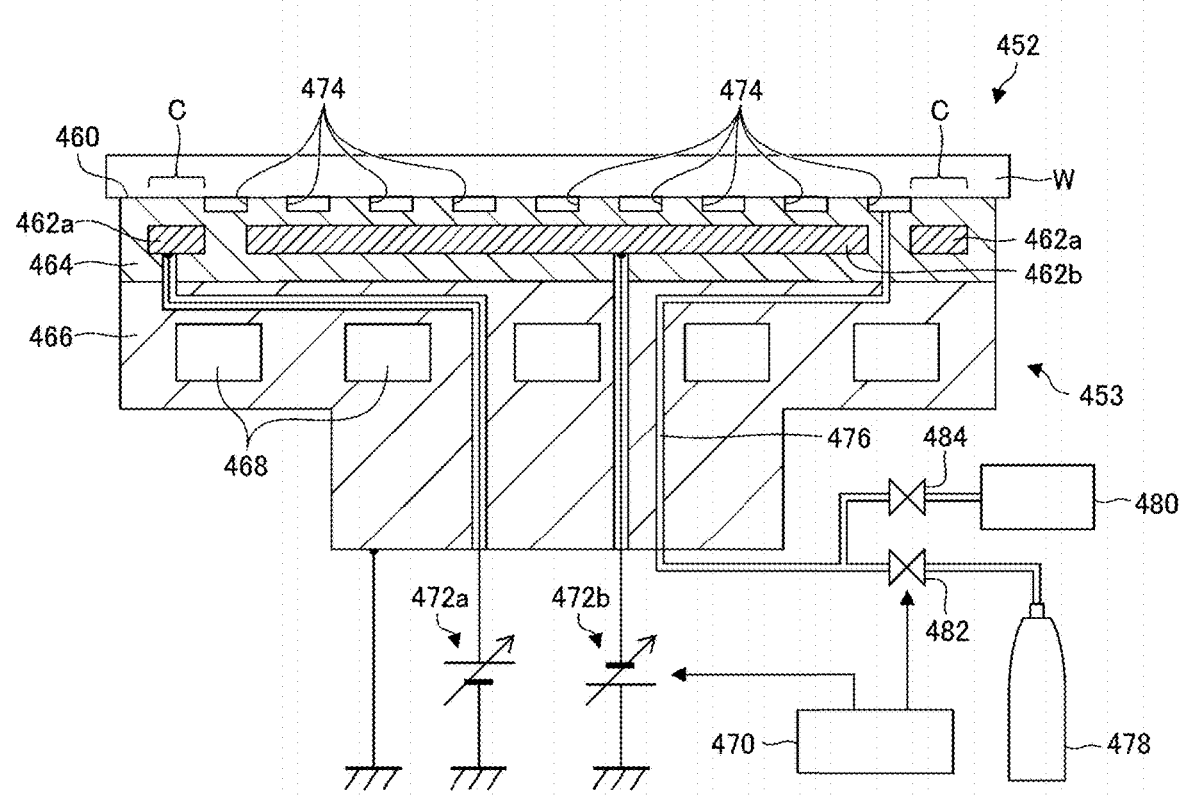
FIG. 9 is a sectional view schematically showing a configuration of a wafer holding device according to another example.

FIG. 9 is a top view schematically showing a configuration of a wafer holding device 452 according to another example. The present embodiment is different from the above-described embodiment in that grooves 474 are provided on a wafer holding surface 460 and the wafer W is cooled or heated by a heat transfer gas supplied to the grooves 474. Hereinafter, in the present embodiment, differences between both the present embodiment and the above-described embodiment and the modification examples will be mainly described.

The wafer holding device 452 includes a wafer chuck 453 and a controller 470. The wafer chuck 453 includes a plurality of electrode structures 462a and 462b, an insulating layer 464, and a base member 466. A cooling water channel 468 and a gas flow path 476 are provided in the base member 466.

For example, the first electrode structure 462a and the second electrode structure 462b are configured to be similar to those of the modification example shown in FIG. 7. The first electrode structure 462a includes an outer peripheral electrode portion which is formed in a closed loop shape along an outer periphery of the wafer holding surface 460. The second electrode structure 462b is provided inside the outer peripheral electrode portion of the first electrode structure 462a. A first power supply 472a is connected to the first electrode structure 462a and a second power supply 472b is connected to the second electrode structure 462b.

The grooves 474 which is filled with the heat transfer gas for cooling or heating the wafer W are provided on the wafer holding surface 460. The grooves 474 are formed inside the outer peripheral electrode portion of the first electrode structure 462a, and for example, are formed at a position between the first electrode structure 462a and the second electrode structure 462b. The grooves 474 are configured to form a closed space in a state where the wafer W is fixed to the wafer holding surface 460. Particularly, the attraction force is generated in an outer peripheral region C corresponding to the outer peripheral electrode portion of the first electrode structure 462a, and thus, the grooves 474 can be sealed with respect to the outside of the wafer chuck 453.

The grooves 474 are connected to the gas flow path 476 which is provided in the insulating layer 464 and the base member 466. The grooves 474 are filled with the heat transfer gas through the gas flow path 476 and the heat transfer gas is evacuated from the grooves 474 through the gas flow path 476. The gas flow path 476 is connected to a gas supply unit 478 via a supply valve 482 and is connected to an exhaust unit 480 via an exhaust valve 484. By closing the exhaust valve 484 and opening the supply valve 482, the heat transfer gas is supplied from the gas supply unit 478 to the grooves 474. By closing the supply valve 482 and opening the exhaust valve 484, the heat transfer gas is evacuated through the gas flow path 476 from the grooves 474. Operations of the supply valve 482 and the exhaust valve 484 are controlled by the controller 470.

The controller 470 applies DC voltages to the first electrode structure 462a and the second electrode structure 462b to fix the wafer W. After the wafer W is fixed, the controller 470 supplies the heat transfer gas to the grooves 474 by opening the supply valve 482. As a result, when the wafer W is fixed, a portion between the wafer W and the wafer holding surface 460 is filled with the heat transfer gas. The wafer holding device 452 is disposed in the implantation process chamber being a high-vacuum state, and thus, if the fixing of the wafer W is released in a state where the heat transfer gas exists in the grooves 474, the wafer W jumps upward due to expansion of the heat transfer gas.

Before the fixing of the wafer W is released, if the heat transfer gas can be evacuated to the outside using the gas exhaust unit 480, the jumping upward of the wafer W may be prevented. However, since it takes a long time to cause a degree of vacuum in the grooves 474 to be equivalent to that in the implantation process chamber 16, if the fixing of the wafer W is released after the heat transfer gas is sufficiently evacuated, the productivity of the ion implanter 10 greatly deteriorates.

Accordingly, in the present embodiment, the attraction force in the outer peripheral region C is decreased in the temporarily fixing state such that the heat transfer gas is evacuated from the outer periphery of the wafer holding surface 460 to the outside. Specifically, the voltage applied to the first electrode structure 462a corresponding to the outer peripheral region C is set to 0 V, and the voltage applied to the second electrode structure 462b positioned inside the outer peripheral region C is maintained at the applied voltage when the wafer W is fixed. Alternatively, the voltage applied to the first electrode structure 462a corresponding to the outer peripheral region C is set to approximately $\frac{1}{10}$ to $\frac{1}{2}$ of the voltage when the wafer W is fixed, and the voltage applied to the second electrode structure 462b positioned inside the outer peripheral region C is maintained at the applied voltage when the wafer W is fixed. Accordingly, it is possible to appropriately evacuate the heat transfer gas between the wafer W and the wafer holding surface 460 while holding the wafer W. According to the present embodiment, it is possible to complete the evacuation of the heat transfer gas in a relatively short period of time and to prevent the wafer W from jumping upward when the fixing of the wafer W is released. Therefore, it is possible to suppress the deterioration of the productivity of the ion implanter 10.

It should be understood that the invention is not limited to the above-described embodiment, but may be modified into various forms on the basis of the spirit of the invention. Additionally, the modifications are included in the scope of the invention.

In the above-described embodiments and modification examples, the case where the wafer holding device is used in the ion implanter 10 is described. However, the application example of the wafer holding device is not particularly limited, and the above-described wafer holding device can be used in an arbitrary semiconductor processing device. Particularly, the above-described wafer holding device is used in a vacuum chamber, and thus, it is possible to appropriately prevent the wafer W from jumping upward under a vacuum environment.

What is claimed is:

1. A wafer holding device, comprising:
   a wafer chuck that includes a wafer holding surface coming into contact with a wafer to be held and a plurality of attraction regions provided on the wafer holding surface; and
   a controller configured to independently control an attraction force of an at least one of the plurality of attraction regions,
   wherein in a case where fixing of the wafer is released, the controller establishes a temporarily fixing state in which the attraction force of the at least one of the plurality of attraction regions is smaller than an attraction force in fixing the wafer, and thereafter, the controller sets attraction forces of all of the plurality of attraction regions to be smaller than the attraction force in fixing the wafer, and
   wherein in the temporarily fixing state, the controller sequentially switches the at least one of the plurality of attraction regions having the attraction forces smaller than the attraction force in fixing the wafer while preventing all of the plurality of attraction regions from simultaneously having the attraction forces smaller than the attraction force in fixing the wafer.

2. The wafer holding device according to claim 1, wherein the controller maintains the temporarily fixing state such that a gas existing between the wafer and the at least one of the plurality of attraction regions is evacuated to outside.

3. The wafer holding device according to claim 2, wherein the controller maintains the temporarily fixing state in a period of 0.1 seconds to 10 seconds.

4. The wafer holding device according to claim 1, wherein the controller changes a duration to maintain the temporarily fixing state according to a condition related to the wafer.

5. The wafer holding device according to claim 4, wherein the condition related to the wafer is dependent on at least one of a fixing time of the wafer, a heating value input to the wafer, a material of a backside surface of the wafer coming into contact with the wafer holding surface, a weight of the wafer, and a thickness of the wafer.

6. The wafer holding device according to claim 1, wherein in the temporarily fixing state, the controller maintains an attraction force of further at least one of the plurality of attraction regions different from the at least one of the plurality of attraction regions to be the attraction force in fixing the wafer.

7. The wafer holding device according to claim 1, wherein the wafer chuck includes an insulating layer having the wafer holding surface and a plurality of electrode structures provided at positions corresponding to the plurality of attraction regions inside the insulating layer, and
wherein the controller sets an absolute value or an amplitude of a voltage applied to each electrode structure to be smaller than the absolute value or the amplitude of the voltage in fixing the wafer so as to reduce the attraction force of each attraction region corresponding to each electrode structure.

8. The wafer holding device according to claim 7, wherein the wafer chuck further includes a base member which supports the insulating layer, and
wherein the controller sets the voltage applied to each electrode structure to be the same electric potential as that of the base member so as to reduce the attraction force of each attraction region corresponding to each electrode structure.

9. The wafer holding device according to claim 7, wherein a DC voltage is applied to at least one of the plurality of electrode structures.

10. The wafer holding device according to claim 7, wherein an AC voltage is applied to at least one of the plurality of electrode structures, and
wherein the maintaining duration of the temporarily fixing state is longer than a period of the AC voltage.

11. The wafer holding device according to claim 1, wherein the wafer holding surface includes a groove to be filled with a heat transfer gas used to cool or heat the wafer, and
wherein the controller establishes the temporarily fixing state so as to evacuate the heat transfer gas remaining between the wafer and the wafer holding surface to outside.

12. The wafer holding device according to claim 1, wherein one of the plurality of attraction regions is provided to include a closed loop-shaped region along an outer periphery of the wafer holding surface, and
wherein in the temporarily fixing state, the controller sets an attraction force of the closed loop-shaped region to be smaller than the attraction force in fixing the wafer.

13. The wafer holding device according to claim 12, wherein in the temporarily fixing state, the controller maintains an attraction force of at least one attraction region provided inside the closed loop-shaped region to be the attraction force in fixing the wafer.

14. A wafer holding device, comprising:
a wafer chuck that includes a wafer holding surface coming into contact with a wafer to be held and a plurality of attraction regions provided on the wafer holding surface; and
a controller configured to independently control an attraction force of an at least one of the plurality of attraction regions,
wherein in a case where fixing of the wafer is released, the controller establishes a temporarily fixing state in which the attraction force of the at least one of the plurality of attraction regions is smaller than an attraction force in fixing the wafer, and thereafter, the controller sets attraction forces of all of the plurality of attraction regions to be smaller than the attraction force in fixing the wafer,
wherein the plurality of attraction regions include a first attraction region and a second attraction region, and
wherein in the case where the fixing of the wafer is released, the controller establishes a first temporarily fixing state in which an attraction force of the second attraction region is smaller than the attraction force in fixing the wafer while maintaining an attraction force of the first attraction region to be the attraction force in fixing the wafer, and thereafter, the controller establishes a second temporarily fixing state in which the attraction force of the first attraction region is smaller than the attraction force in fixing the wafer while maintaining the attraction force of the second attraction region to be the attraction force in fixing the wafer.

15. The wafer holding device according to claim 14, wherein the controller alternately repeats the first temporarily fixing state and the second temporarily fixing state.

16. The wafer holding device according to claim 14, wherein the controller returns the attraction forces of both the first attraction region and the second attraction region to the attraction force in fixing the wafer in a period between the first temporarily fixing state and the second temporarily fixing state.

17. The wafer holding device according to claim 14, wherein the controller changes at least one of a maintaining duration and a number of times of execution of each of the first temporarily fixing state and the second temporarily fixing state according to a condition related to the wafer.

18. A wafer chucking and dechucking method using a wafer chuck, in which the wafer chuck includes a wafer holding surface coming into contact with a wafer to be held and a plurality of attraction regions provided on the wafer holding surface, the method comprising:
in a case where fixing of the wafer is released, establishing a temporarily fixing state in which an attraction force of an at least one of the plurality of attraction regions is smaller than an attraction force in fixing the wafer; and
thereafter, setting attraction forces of all of the plurality of attraction regions to be smaller than the attraction force in fixing the wafer, wherein establishing the temporarily fixing state includes sequentially switching the at least one of the plurality of attraction regions having the attraction forces smaller than the attraction force in fixing the wafer while preventing all of the plurality of attraction regions from simultaneously having the attraction forces smaller than the attraction force in fixing the wafer.

* * * * *